United States Patent [19]

Yamauchi

[11] Patent Number: 5,251,171
[45] Date of Patent: Oct. 5, 1993

[54] METHOD OF OPERATING A SEMICONDUCTOR MEMORY DEVICE

[75] Inventor: Yoshimitsu Yamauchi, Nara, Japan
[73] Assignee: Sharp Kabushiki Kaisha, Osaka, Japan
[21] Appl. No.: 644,332
[22] Filed: Jan. 18, 1991
[30] Foreign Application Priority Data
  Jan. 19, 1990 [JP] Japan .................................. 2-11050
[51] Int. Cl.$^5$ .............................................. G11C 11/40
[52] U.S. Cl. .................................... 365/185; 365/228; 365/218; 365/182; 257/296; 257/314; 257/908
[58] Field of Search ............... 365/185, 218, 228, 182; 257/296, 314, 908

[56] References Cited

U.S. PATENT DOCUMENTS 4,903,236 2/1990 Nakayama et al. ................. 365/185
5,043,946 8/1991 Yamauchi et al. .................. 365/228

OTHER PUBLICATIONS

Yamauchi et al., *IEDM* 88:416–419.
Yamauchi et al., *IEDM* 89:595–598.

U.S. Patent Application Ser. No. 07/549,293 (filed Jul. 6, 1990).

Primary Examiner—Eugene R. LaRoche
Assistant Examiner—Viet Q. Nguyen
Attorney, Agent, or Firm—Morrison & Foerster

[57] ABSTRACT

A method which can operate a semiconductor memory device having a volatile memory and a non-volatile memory without lowering the retention characteristic of the non-volatile memory is described. The volatile memory includes a MOS transistor, and a capacitor, one electrode of which is connected to the source of the MOS transistor. The non-volatile memory includes a floating gate transistor. The semiconductor memory device further has a switch connected between the source of the MOS transistor and the drain of the floating gate transistor. The control gate of the floating gate transistor is connected to the source of the MOS transistor. When the switch is off and the volatile memory to be operated, a voltage which is substantially one half of that of a power source voltage with respect to the ground level is applied to the source of the floating gate transistor.

1 Claim, 5 Drawing Sheets

| | DRAM DATA | EEPROM SECTION | EEPROM DATA |
|---|---|---|---|
| STEP 1 | "0" |  | ERASE STATE |
| | "1" |  | |
| STEP 2 | "0" |  | WRITE STATE |
| | "1" |  | ERASE STATE |

| OPERATION MODE | | APPLIED BIAS | | | | |
|---|---|---|---|---|---|---|
| | | 1 | 2 | 6 | 7 | 8 |
| WRITE OF DRAM | | Vcc/0 | 0 | Vsg | 0 | 0 |
| REWRITE OF EEPROM | STEP 1 | 0 | 0 | 0 | 0 | Vpp |
| | STEP 2 | 0 | Vpp | 0 | 0 | 0 |

| WRITE OF DRAM | Vcc/0 | OPEN | Vsg | V7 | 0 |
|---|---|---|---|---|---|
| DRAM → EEPROM | 0 | V2 | 0 | V7 | 0 |

METHOD OF OPERATING A SEMICONDUCTOR MEMORY DEVICE

BACKGROUND OF THE INVENTION

1. Field of the Invention:

This invention relates to a method of operating a semiconductor memory device, and more particularly to a method of operating a semiconductor memory device having a volatile memory means and a non-volatile memory means.

2. Description of the Prior Knowledge:

Semiconductor memory devices of the prior art include a mask ROM (Read-Only Memory), an EEPROM (Electrically Erasable Programmable Read-Only Memory) and other types of non-volatile memory devices which can retain their storage contents even when the power is off, and a DRAM (Dynamic Random-Access Memory) and other volatile memory devices which lose their storage contents when the power is off.

Non-volatile memory devices, a mask ROM and EEPROM are capable of retaining stored data for a long period of time after the power is cut off. However, in the case of a mask ROM, data cannot be rewritten after it has been written in a wafer process. In the case of an EEPROM, data can be rewritten after it has been arranged in an apparatus, but the period for data write/erase is as long as 10 ms and there is a limit to the number of possible write/erase cycles, so these devices are not suitable to applications in which data is repeatedly rewritten. In the case of RAM, however, which is volatile memory, data rewrite time is less than 10 ns and there is no limit to the number of times data can be rewritten, but when the power source is cut off, all stored data is lost.

Recently, the inventor invented a multiple-use semiconductor memory device in which data can be rewritten rapidly, and stored data can be retained for a long period of time in the absence of power supply (U.S. Ser. No. 549,293 filed Jul. 6, 1990).

FIG. 3 shows such an improved semiconductor memory device. The semiconductor memory device of FIG. 3 has a DRAM section DM comprising one MOS transistor T1 and one capacitor C, and an EEPROM section EM comprising a floating gate transistor MT. The source 10 of the transistor T1 is connected to the accumulation node 3 of the capacitor C, and the drain 9 of the transistor MT is connected to the accumulation node 3 via a mode selector transistor T2 which functions as a switch means. The control gate 5 of the transistor MT is also connected to the accumulation node 3. The transistor T2 is switched on or off by applying a positive bias voltage V7 or a zero bias on the gate terminal (mode selector gate) 7.

FIG. 8 shows a cross sectional view of the device of FIG. 3 which is formed on a semiconductor substrate 20. As shown in FIG. 8, the source 2 and drain 9 of the transistor MT are diffused areas which are formed below the floating gate 4. Between the source 2 and the floating gate 4, a tunnel oxide film 4a is disposed. The gate electrode 6 of the transistor T1 is connected to a word line, and the drain 1 is connected to a bit line BL.

This semiconductor device operates as follows when the transistor T2 is off, i.e., when the mode selector gate 7 is zero biased.

(1) First, as shown in FIG. 4, the DRAM section DM is electrically isolated. When data is to be written into the DRAM section DM, a cell selector gate voltage Vsg is applied to the gate terminal 6 to turn on the transistor T1, and the power source voltage Vcc or zero bias is applied to the drain 1, as shown in the top row of FIG. 6A. In response to the above, the potential of the accumulation node 3 becomes Vcc or 0. That is, the data in the DRAM section DM becomes "1" or "0". The source 2 of the transistor MT is zero biased.

(2) When data is written into the EEPROM section EM, as shown in the middle row of FIG. 6A, first the gate terminal 6 and drain 1 of the transistor T1 are zero biased to disable the DRAM section DM, and the source 2 of the transistor MT is zero biased while the program voltage Vpp which is greater than the power source voltage Vcc is applied to the other electrode (plate electrode) terminal 8 of the capacitor C. Then, electrons accumulate in the floating gate 4 through the tunnel oxide film 4a regardless of whether the data in the DRAM section DM is "0" or "1", and the threshold value of the transistor T2 becomes high (erase state), as shown in the column "step 1" of FIG. 5. At this time, the charges of the accumulation node 3 of the capacitor C do not escape since the transistor T2 is in the off state, so the data stored in the DRAM section DM does not change when the EEPROM section EM goes to the erase state. However, the capacitance of the capacitor C must be designed sufficiently large compared to the gate capacitances $C_{52}$ (capacitance between the control gate 5 and the source 2) and $C_5$ (capacitance between the control gate 5 and the substrate) of the transistor MT.

Then, as shown in the bottom row of FIG. 6A, the potential of the source 2 of the transistor MT is made to the program voltage Vpp while the plate electrode 8 of the capacitor C is zero biased. The storage contents of the EEPROM section EM change corresponding to the data state "0" or "1" of the DRAM section DM. For the sake of explanation, the coupling ratio Rc of the transistor MT is defined by the following expression:

$$Rc = \frac{C_{45}}{C_{42} + C_{45} + C_4}$$

where $C_{45}$ is the capacitance between the floating gate 4 and the control gate 5, $C_4$ is the capacitance between the floating gate 4 and the substrate, and $C_{42}$ is the capacitance between the floating gate 4 and the source 2. Then, the voltage applied to the tunnel oxide film 4a is:

(a) when the DRAM data is "0", $V_0 (= Rc \cdot Vpp)$; or
(b) when the DRAM data is "1", $V_1 (= Rc(Vpp - Vcc))$.

That is, when the DRAM data is "0", a voltage which is higher by $$V = V_0 - V_1 = Rc \cdot Vcc$$

than in the case when the DRAM data is "1" is applied to the tunnel oxide film 4a.

In the case of (a) (when the DRAM data is "0"), the electrons accumulated in the floating gate 4 are pulled toward the source 2 because the voltage applied to the tunnel oxide film 4a is high. As a result, even if the potential of the floating gate 4 becomes high and the transistor MT turns to the on state, the electrons do not flow to the drain 9 since the transistor T2 is in the off state. In this way, many electrons are pulled away and the threshold value of the transistor MT becomes low (write state).

In the case of (b) (when the DRAM data is "1"), electrons remain accumulated in the floating gate 4 since the voltage applied to the tunnel oxide film 4a is low. Therefore, the threshold value of the transistor MT remains high (erase state).

In this way, the storage contents of the EEPROM section EM can be set to a write state (low threshold value) or erase state (high threshold value) in accordance with "0" or "1" of the data contents of the DRAM section DM, while the data contents of the DRAM section DM are retained.

Next, the on state of the transistor T2, i.e., the state wherein a positive bias V7 is applied to the mode selection gate 7 will be described.

(3) As shown in the top row of FIG. 6B, the DRAM section DM operates in the same way as in the off state described above, by setting the source 2 of the transistor MT to the open state and zero biasing the plate terminal 8 of the capacitor C.

(4) When data is to be written into the EEPROM section EM, the drain 1 and cell selection gate terminal 6 of the transistor T1 are zero biased to disable the DRAM section DM, as shown in the bottom row in FIGS. 6B and 7, a bias V2 for transfer is applied to the source 2 of the transistor MT while the plate terminal 8 of the capacitor C is zero biased.

As in the case where the transistor T2 is in the off state, the storage contents of the EEPROM section EM can be set to the write state or the erase state in accordance with the DRAM data "0" or "1". As shown in the equivalent circuit of FIG. 7, the drain 9 of the transistor MT is connected to the accumulation node 3 of the capacitor C, so that the charge of the accumulation node 3 is lost during the write operation through the drain 9 of the transistor MT. That is, the DRAM data is not retained, and transferred to the EEPROM section EM.

In this way, the improved semiconductor memory device operates as a DRAM capable of continually rewriting data at high speed, and is able to transfer data from a DRAM section DM to an EEPROM section EM, and also to rewrite EEPROM data while retaining DRAM data. Furthermore, even when the power is off, this device can store data as an EEPROM over a long period of time, thus giving it a wide range of applicability.

The improved semiconductor memory device in the state in which data is written in the DRAM section DM while the transistor T2 is off has the equivalent circuit shown in FIG. 2. When data is to be written into the DRAM section DM, the voltage Vsg is applied to the gate terminal 6 to turn on the transistor T1. In this condition, the power source voltage Vcc or zero bias is applied to the drain 1 through the transistor T1, and the source 2 of the transistor MT is zero biased (the potential is 0 V). During the operation of the DRAM section DM, therefore, the potential difference between the control gate 5 and the source 2 of the transistor MT is the power source voltage Vcc at the maximum. The storage contents of the transistor MT is rewritten by the application of the program voltage Vpp which is greater than the power source voltage Vcc. Hence, the application of the power source voltage Vcc is not directly led to the rewriting of the storage contents of the transistor MT.

In such a semiconductor memory device, however, it has been found that, when the DRAM section DM is operated for a long period of time while retaining the data initially stored in the transistor MT (i.e., without rewriting the storage contents of the transistor MT), charges move through the tunnel oxide film 4a due to Fowler-Nordheim tunneling, to be gradually accumulated over a long span of time, resulting in that the storage contents initially stored in the transistor MT may be changed. In this way, the above-described method of operating the improved semiconductor memory device involves a problem in that the characteristics of retaining storage contents (read retention) is impaired.

SUMMARY OF THE INVENTION

The method of this invention, which overcomes the above-discussed and numerous other disadvantages and deficiencies of the prior art. In this method, a semiconductor memory device comprising a volatile memory means and a non-volatile memory means is operated, said volatile memory means comprising a MOS transistor, and a capacitor means, one electrode of said capacitor means being connected to the source of said MOS transistor, said non-volatile memory means comprises a floating gate transistor, said semiconductor memory device further comprising a switch means connected between said source of said MOS transistor and one source/drain of said floating gate transistor, the control gate of said floating gate transistor being connected to said source of said MOS transistor. This method comprises the step of, when said switch means is off and said volatile memory means are to be operated, applying a voltage to the other source/drain of said floating gate transistor, the level of said voltage being substantially one half of that of a power source voltage with respect to the ground level.

Thus, the invention described herein makes possible the objectives of:

(1) providing a method of operating a semiconductor memory device comprising a volatile memory means and a non-volatile memory means, which can operate the volatile memory means with a longer period of time of retaining contents of the non-volatile memory means;

(2) providing a method of operating a semiconductor memory device comprising a volatile memory means and a non-volatile memory means, which can operate the volatile memory means without lowering the retention characteristic of the non-volatile memory means; and (3) providing a method of operating a semiconductor memory device comprising a volatile memory means and a non-volatile memory means, in which the amount of current leak is reduced.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The current flowing through the tunnel oxide film 4a is generated by Fowler-Nordheim tunneling. When the strength of the electric field applied to the tunnel oxide film 4a is defined as Eox and the constants of Fowler-Nordheim tunneling are defined as A and B, the current density J is expressed as $$J = A \cdot Eox^2 \cdot \exp(-B/Eox) \quad (1)$$

and it is highly dependent on the strength of the electric field Eox. When the voltage applied to the tunnel oxide film 4a is defined as Vox, the film thickness as Tox and the coupling ratio as Rc, the strength of the electric field Eox is expressed as $$Eox = Vox/Tox = Rc \cdot V/Tox \quad (2)$$

Since the film thickness Tox and the coupling ratio Rc are determined by the structure of the floating gate transistor, the strength of the electric field Eox varies proportionally to the applied voltage V. That is, the current density J of Fowler-Nordheim tunneling is largely dependent on the voltage V applied between the control gate and the source of the floating gate transistor.

Therefore, when the potential of the source of the floating gate transistor is made approximately half the power source voltage with respect to ground level while operating the volatile memory means, the voltage V applied between the control gate and the source of the floating gate transistor is low, and as a result, the amount of the leak current is reduced. By this means, the amount of charges moving through the tunnel oxide film is reduced, and the retention characteristic of the non-volatile memory means is improved.

An embodiment of the invention in which the above-described semiconductor memory device is operated will be described.

Figure 1:
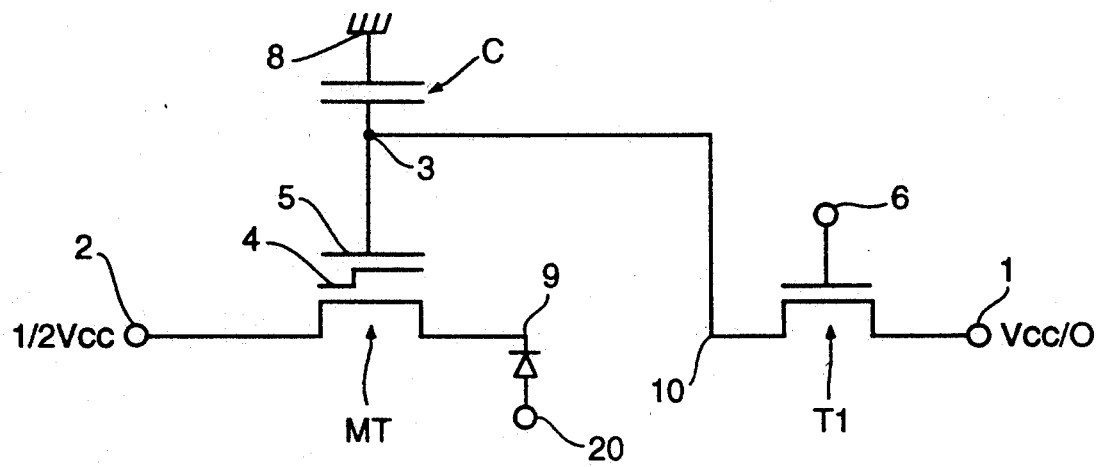
FIG. 1 is a circuit diagram of an improved semiconductor memory device illustrating an embodiment of the invention.

When the transistor T2 which functions as a switch means is off, the semiconductor memory device has the equivalent circuit shown in FIG. 1. In this equivalent circuit, when the voltage Vsg is applied to the terminal 6 to turn on the transistor T1, the power source voltage Vcc or the ground potential 0 appearing at the drain 1 is supplied to the control gate 5 of the transistor MT via the transistor T1, in the same manner as in the operation described with reference to FIG. 2. To the source 2 of the transistor MT, is applied a voltage which is one half of the power source voltage Vcc applied externally. That is, the voltage V applied between the control gate 5 and the source 2 of the transistor MT is Vcc/2 (V=Vcc/2). By contrast, in the operation shown in FIG. 2, the voltage V is Vcc (V=Vcc). Here, assuming that the power source voltage Vcc is 5 V, the thickness of the tunnel oxide film 4a is 100 angstroms and the coupling ratio Rc is 0.8, then based on expression (2), the electric field Eox in the tunnel oxide film 4a is $$Eox = 2 (MV/cm) \text{ when } V = Vcc/2$$

$$Eox = 4 (MV/cm) \text{ when } V = Vcc$$

Figure 2:
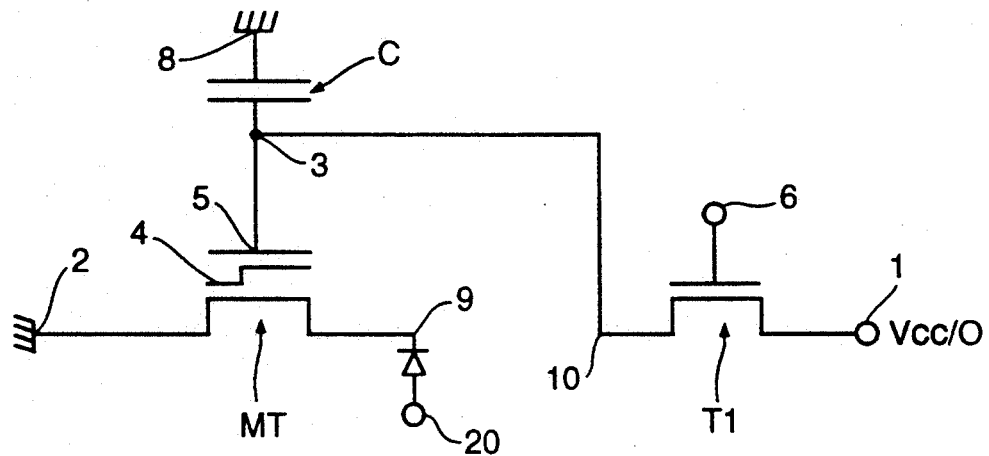
FIG. 2 is a circuit diagram of the semiconductor memory device illustrating another operating method which was proposed by the inventor.
Figure 3:
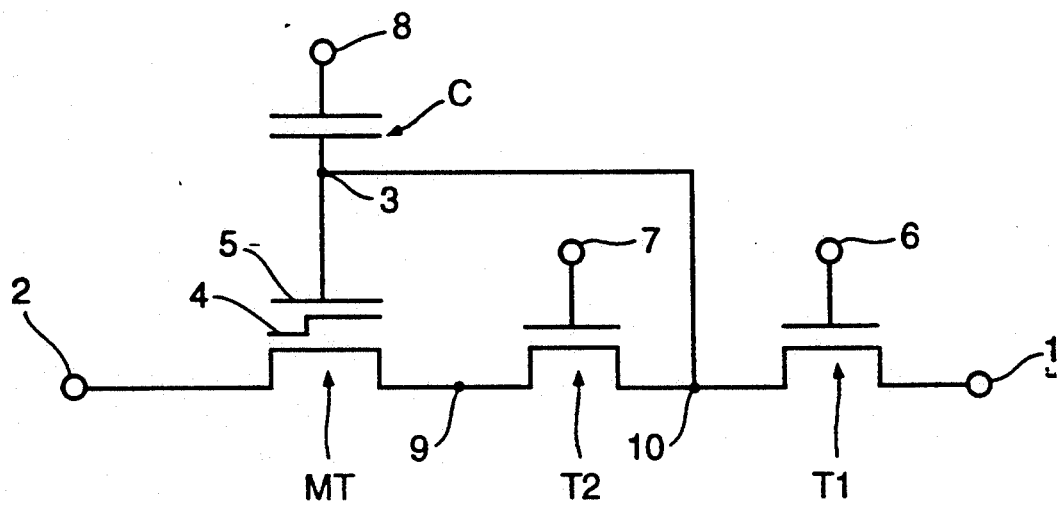
FIG. 3 is a circuit diagram illustrating the semiconductor memory device.
Figure 4:
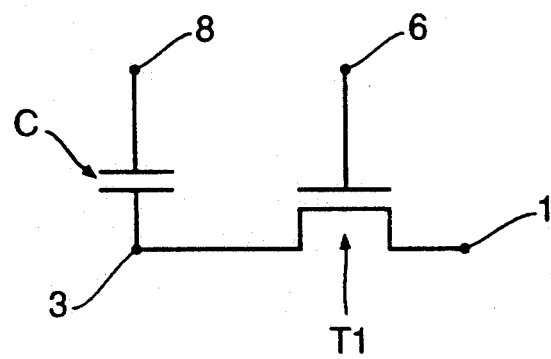
FIG. 4 is a circuit diagram illustrating the DRAM section of the semiconductor memory device.
Figure 5:
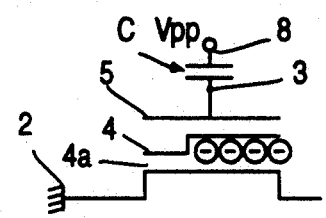
FIG. 5 shows the operation of the semiconductor memory device.
Figure 5:
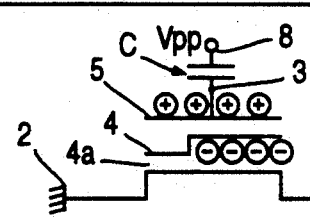
Figure 5:
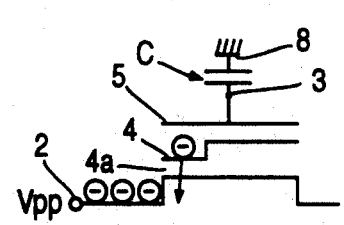
Figure 5:
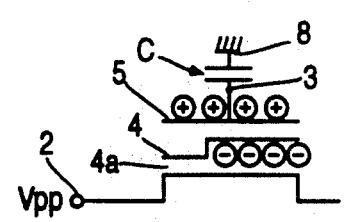
Figures 6A, 6B, 7:
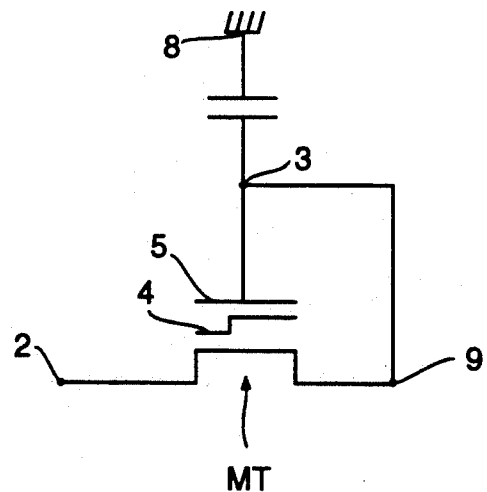
FIGS. 6A and 6B show various bias conditions in the operation of the semiconductor memory device.
FIG. 7 is a circuit diagram illustrating the EEPROM section of the semiconductor memory device.
Figure 8:
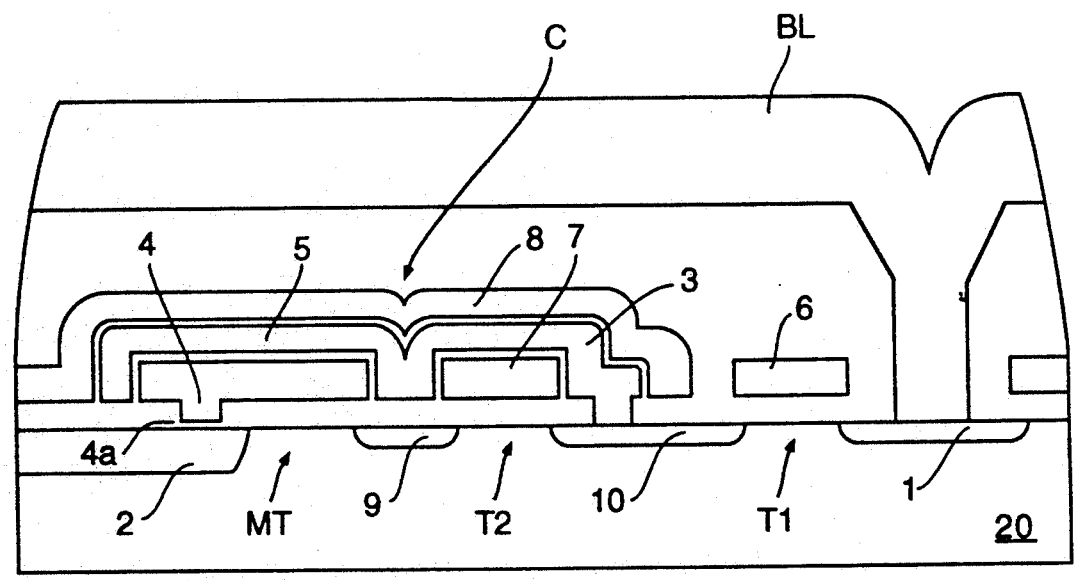
FIG. 8 is a sectional view of the semiconductor memory device.

In this way, according to this embodiment, the electric field Eox can be reduced by half as compared to the operation method shown in FIG. 2. Since the current flowing through the tunnel oxide film 4a is largely dependent on the electric field Eox as seen from expression (1), the leak current can be greatly reduced according to this embodiment. Therefore, the retention characteristic of the EEPROM can be greatly improved. Experimental results showed that, compared to the operation method shown in FIG. 2, this operation method can reduce the leak current during DRAM operation by an order of 5 and lengthen the data retention time of the EEPROM by an order of 5.

According to the invention, when the volatile semiconductor memory is operated, the voltage applied to the non-volatile memory means can be reduced, and the retention characteristic of the non-volatile memory means can be effectively improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of operating a semiconductor memory device comprising a volatile memory means and a non-volatile memory means, said volatile memory means comprising a MOS transistor, and a capacitor means, one electrode of said capacitor means being connected to the source of said MOS transistor, said non-volatile memory means comprising a floating gate transistor, said semiconductor memory device further comprising a switch means connected between said source of said MOS transistor and one of a source and a drain of said floating gate transistor, the control gate of said floating gate transistor being connected to said source of said MOS transistor, said method comprising the step of, when said switch means is off and said semiconductor memory device works as a volatile memory, applying a voltage to the other of said source and drain of said floating gate transistor, the level of said voltage being substantially one half of that of a power source voltage with respect to the ground level.

* * * * *